(12) United States Patent
Cheng et al.

(10) Patent No.: US 8,497,710 B2
(45) Date of Patent: Jul. 30, 2013

(54) LOW-OFFSET CURRENT-SENSE AMPLIFIER AND OPERATING METHOD THEREOF

(75) Inventors: Meng-Fan Cheng, Hsinchu (TW); Yu-Fan Lin, Hsinchu (TW); Shin-Jang Shen, Hsinchu (TW); Yu-Der Chen, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 176 days.

(21) Appl. No.: 13/108,577

(22) Filed: May 16, 2011

(65) Prior Publication Data

US 2012/0293260 A1    Nov. 22, 2012

(51) Int. Cl.
*G01R 19/00* (2006.01)
*G01C 7/00* (2006.01)
*H03F 3/45* (2006.01)

(52) U.S. Cl.
USPC .......................................................... 327/52

(58) Field of Classification Search
USPC ............................... 327/51–57; 365/207–208
See application file for complete search history.

(56) References Cited

U.S. PATENT DOCUMENTS

| 5,206,552 | A  | * | 4/1993  | Iwashita ......................... 327/53 |
| 5,535,166 | A  | * | 7/1996  | Bateman ....................... 365/208 |
| 5,696,724 | A  | * | 12/1997 | Koh et al. ..................... 365/205 |
| 6,445,616 | B2 | * | 9/2002  | Kim .......................... 365/185.2 |
| 7,477,559 | B2 | * | 1/2009  | Taddeo ......................... 365/205 |
| 7,609,555 | B2 | * | 10/2009 | O .............................. 365/185.2 |
| 7,800,958 | B2 | * | 9/2010  | Kang ....................... 365/189.07 |

* cited by examiner

*Primary Examiner* — Quan Tra
(74) *Attorney, Agent, or Firm* — Wang Law Firm, Inc.; Li K. Wang; Stephen Hsu

(57) ABSTRACT

A low-offset current-sense amplifier and an operating method thereof are disclosed. The low-offset current-sense amplifier includes a sense amplifier, a first current supply unit, a second current supply unit, and a processing unit. The first current supply unit is coupled to the sense amplifier, and includes a first transistor group and a first current output terminal. The second current supply unit is coupled to the sense amplifier, and includes a second transistor group and a second current output terminal. The processing unit controls the on/off of some transistors of the first transistor group and the second transistor group according to electric currents output from the first current output terminal and the second current output terminal, respectively.

11 Claims, 5 Drawing Sheets ized by reference numeral 2,
LOW-OFFSET CURRENT-SENSE AMPLIFIER AND OPERATING METHOD THEREOF

FIELD OF THE INVENTION

The present invention relates to a current-sense amplifier, and more particularly to a low-offset current-sense amplifier and operating method thereof for reducing the current offset of a differential current mirror.

BACKGROUND OF THE INVENTION

With constant progress in technological fields, various kinds of electronic products have been developed to provide people with more convenience and comfort in their daily life. In these electronic products, memory integrated circuits play a very important role. The currently available memory integrated circuits may be generally divided into two types, namely, volatile memory and non-volatile memory, according to their data storage characteristics.

The non-volatile memory can retain the stored data even when no power is supplied thereto, and has been widely applied in memory cards and USB flash drives. Since consumers demand for memory having higher access speed and accuracy but lower power consumption, it has now become an important issue as how to develop a memory with increased data access speed and accuracy to satisfy the market demands. Presently, the most frequently discussed issue is the large voltage or current offset in a current-sense amplifier. The offset of voltage or current would adversely affect the quality of a circuit system. In a current-sense amplifier for memory, inputting of offset current or voltage would cause unstable detection accuracy to thereby reduce the memory data read speed and accordingly, result in incorrect data reading.

Please refer to FIG. 1 that is a schematic circuit diagram of a conventional current-sense amplifier. As shown, the conventional current-sense amplifier often has asymmetrically arranged transistors in a differential current mirror. As a result, cell current $I_{CELL}$ and reference current $I_{REF}$ input to the sense amplifier for comparison are not ideal, which in turn forms a hindrance in increasing memory data read speed and accuracy. It is therefore tried by the inventor to work out a way for effectively reducing the current offset of the differential current mirror in order to enable increased memory data access speed and accuracy.

SUMMARY OF THE INVENTION

A primary object of the present invention is to provide a low-offset current-sense amplifier and an operating method thereof, so as to overcome the problem of non-ideal currents input to the sense amplifier for comparison due to asymmetrically arranged transistors in a differential current mirror.

To achieve the above and other objects, the low-offset current-sense amplifier according to the present invention includes a sense amplifier, a first current supply unit, a second current supply unit, and a processing unit. The sense amplifier includes a first coupling end and a second coupling end. The first current supply is coupled to the first coupling end, and includes a first transistor group and a first current output terminal. The second current supply unit is coupled to the second coupling end and includes a second transistor group and a second current output terminal. The processing unit is coupled to the first current supply unit and the second current supply unit, and controls some transistors in the first transistor group and the second transistor group to on or off according to electric currents output from the first current output terminal and the second current output terminal, respectively.

To achieve the above and other objects, the amplifier operating method according to the present invention is applicable to a low-offset current-sense amplifier having a sense amplifier, a first current supply unit, a second current supply unit and a processing unit, and includes the following steps: controlling some transistors in a first transistor group of the first current supply unit to on or off according to electric currents output from a first current output terminal of the first current supply unit; and controlling some transistors in a second transistor group of the second current supply unit to on or off according to electric currents output from a second current output terminal of the second current supply unit.

According to the present invention, the first transistor group includes a first switch group; the second transistor group includes a second switch group; and the processing unit compares the electric currents output from the first and the second current output terminal to obtain an average current value for controlling some transistors in the first and the second switch group to on or off.

Accordingly, the low-offset current-sense amplifier and the amplifier operating method according to the present invention have the following advantages: enabling accurate selection of transistors having relatively smaller current offset, that is, enabling the use of transistors having smaller process offset to reduce the current offset of a differential current mirror; and enabling increased memory data access speed and accuracy.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
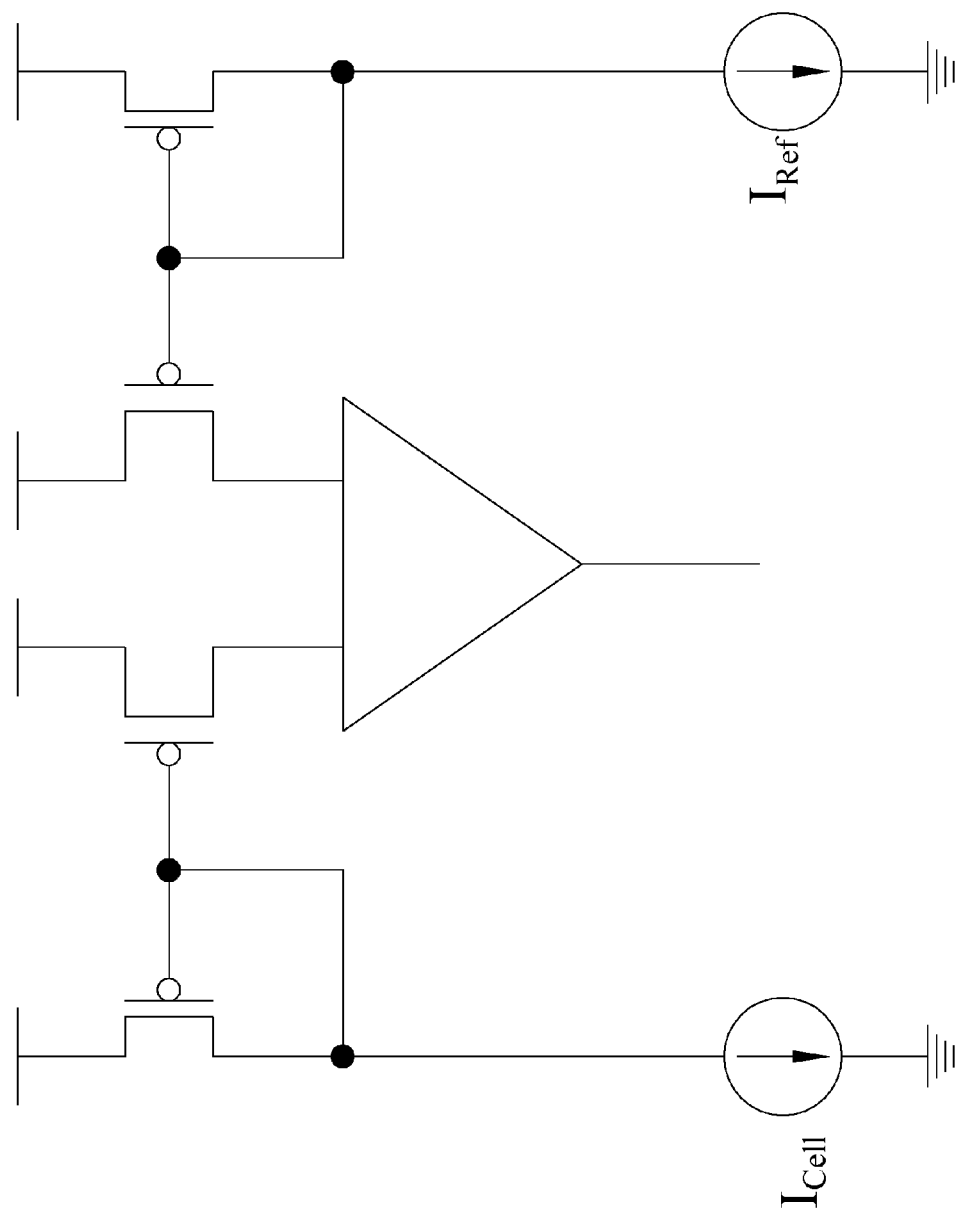
FIG. 1 is a schematic circuit diagram of a conventional current-sense amplifier.

The present invention will now be described with a preferred embodiment thereof and with reference to the accompanying drawings. For the purpose of easy to understand, elements that are the same in the preferred embodiment are denoted by the same reference numeral.

Figure 2:
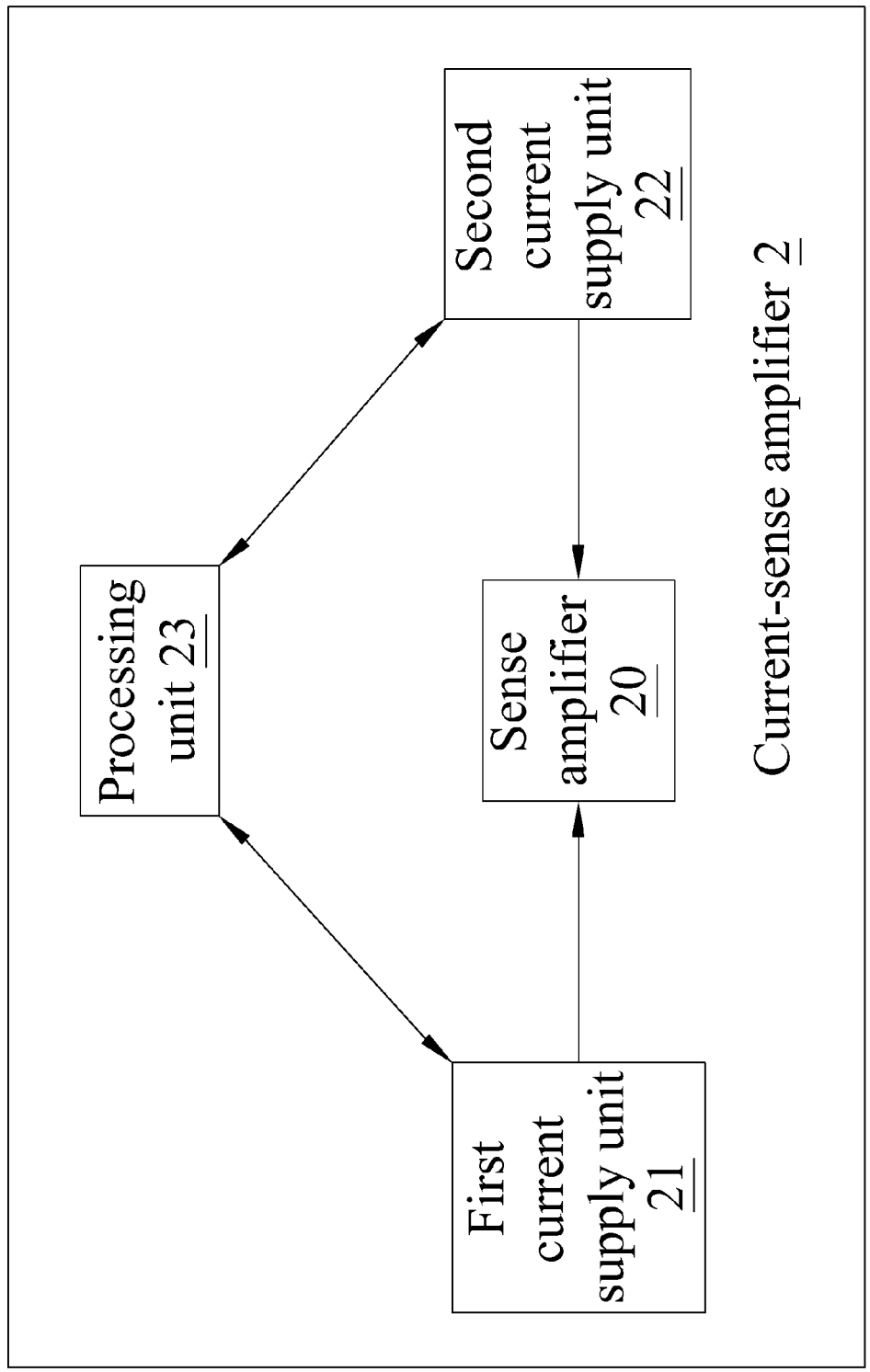
FIG. 2 is a block diagram of a low-offset current-sense amplifier according to a preferred embodiment of the present invention.
Figure 3:
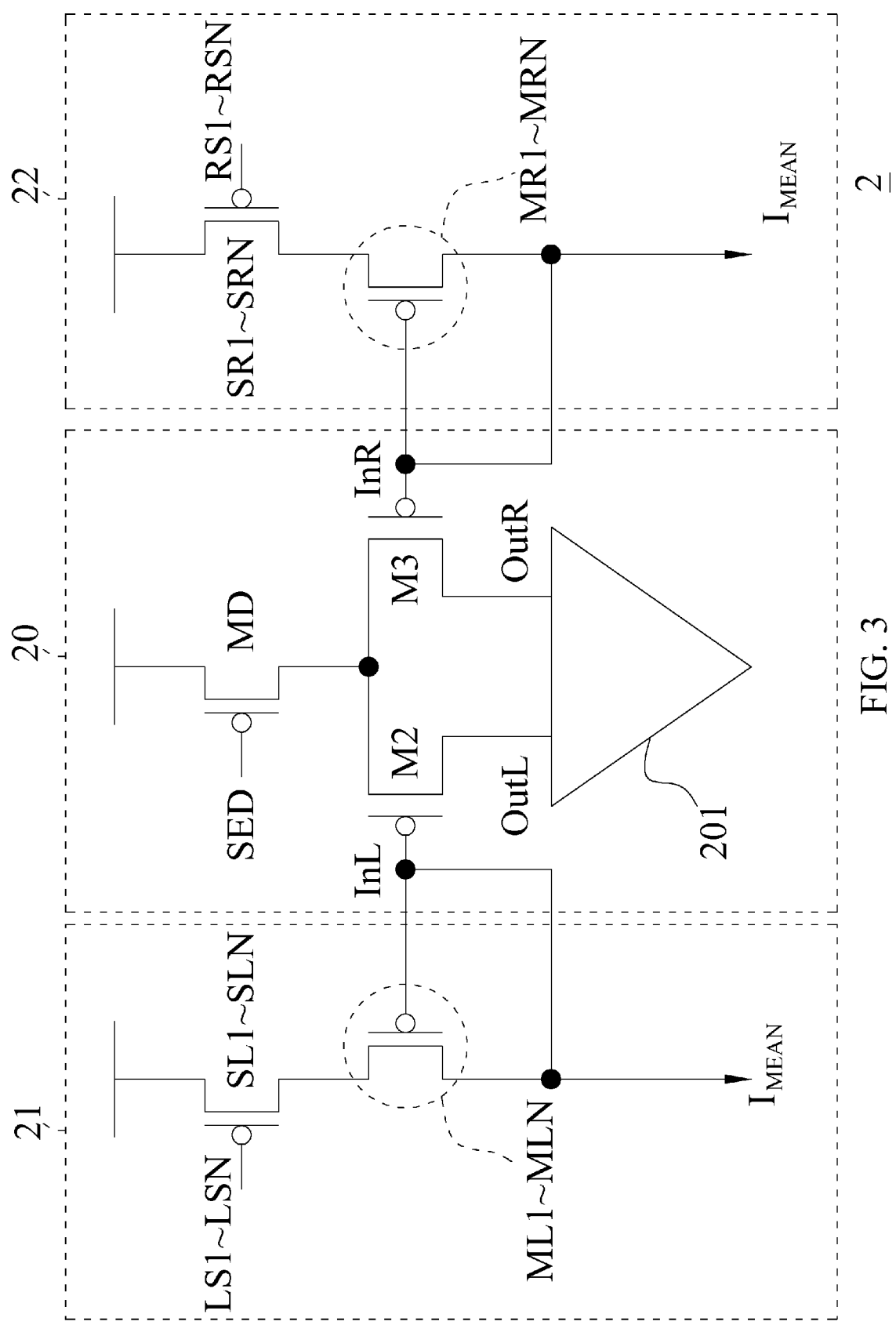
FIG. 3 is a circuit diagram of the low-offset current-sense amplifier according to the preferred embodiment of the present invention.

Please refer to FIG. 2 that is a block diagram of a low-offset current-sense amplifier according to a preferred embodiment of the present invention. As shown, the low-offset current-sense amplifier is generally denoted by reference numeral 2, and includes a sense amplifier 20, a first current supply unit 21, a second current supply unit 22, and a processing unit 23. The first current supply unit 21 is coupled to an end of the sense amplifier 20, while the second current supply unit 22 is coupled to another end of the sense amplifier 20. The processing unit 23 is connected to the first and the second current supply unit 21, 22. Please refer to FIG. 3 that is a circuit diagram of the low-offset current-sense amplifier 2 according to the preferred embodiment of the present invention. As shown, the sense amplifier 20 includes a sense amplifying unit 201, a first transistor MD, a second transistor M2, and a third transistor M3. The first transistor MD has a drain coupled to sources of the second transistor M2 and the third transistor M3, and the first transistor MD controls the on/off of the current flowing to the sense amplifying unit 201 via an electric potential of a digital signal SED. The second transistor M2 and the third transistor M3 are coupled at respective drain to the sense amplifying unit 201. Further, a first coupling end InL is provided at a gate of the second transistor M2, and a second coupling end InR is provided at a gate of the third transistor M3.

The first current supply unit 21 includes two transistor groups, namely, a first transistor group and a second transistor group. The first transistor group includes N pieces of transistors SL1~SLN; and the second transistor group includes N pieces of transistors ML1~MLN. Drains of the N pieces of transistors SL1~SLN in the first transistor group are coupled to sources of the N pieces of transistors ML1~MLN in the second transistor group, respectively; while gates and drains of the N pieces of transistors ML1~MLN in the second transistor group are coupled to one another to form a terminal, which is coupled to the first coupling end InL. The second current supply unit 22 also includes two transistor groups, namely, a third transistor group and a fourth transistor group. The third transistor group includes N pieces of transistors SR1~SRN; and the fourth transistor group includes N pieces of transistors MR1~MRN. Drains of the N pieces of transistors SR1~SRN in the third transistor group are coupled to sources of the N pieces of transistors MR1~MRN in the fourth transistor group, respectively; while gates and drains of the N pieces of transistors MR1~MRN in the fourth transistor group are coupled to one another to form a terminal, which is coupled to the second coupling end InR. Further, all the transistors in the sense amplifier 20, the first current supply unit 21 and the second current supply unit 22 may be P-type metal-oxide-semiconductor field-effect transistors (PMOSFET or PMOS).

The low-offset current-sense amplifier 2 according to the present invention determines whether to use the N pieces of transistors ML1~MLN in the second transistor group and the N pieces of transistors MR1~MRN in the fourth transistor group according to changes in electric potentials of digital signals LS1~LSN and digital signals RS1~RSN, respectively. For example, in the case the digital signal LS1 is 0V, the P-type transistor SL1 in the first transistor group will be opened, and there will be current flowing through the SL1 and the transistor ML1 in the second transistor group to the first coupling end InL; and in the case the digital signal LS1 is VDD, the P-type transistor SL1 in the first transistor group will be closed, and no current will flow through the transistor ML1 in the second transistor group to the first coupling end InL.

Accordingly, in the case a bias voltage is supplied to the first coupling end InL and any process offset in the N pieces of transistors ML1~MLN in the second transistor group is ignored, the electric currents flowing out of the N pieces of transistors ML1~MLN in the second transistor group should be the same. However, in actual condition, process offset is usually presented in the N pieces of transistors ML1~MLN in the second transistor group, and accordingly, the electric currents flowing out of the N pieces of transistors ML1~MLN in the second transistor group would not always be the same. In this case, the processing unit 23 can be used to record each of the electric currents flowing out of the transistors ML1~MLN and calculate an average value of the individual electric currents. Thereafter, it is able to know which ones of the N pieces of transistors ML1~MLN in the second transistor group have current outputs that are most different from the average value of individual electric currents. Since the second coupling end InR and the second current supply unit 22 in another half of the low-offset current-sense amplifier of the present invention have the same configuration as the first coupling end InL and the first current supply unit 21, the same manner as described above can be used to know which ones of the N pieces of transistors MR1~MRN in the fourth transistor group have relatively smaller process offset.

Figure 4:
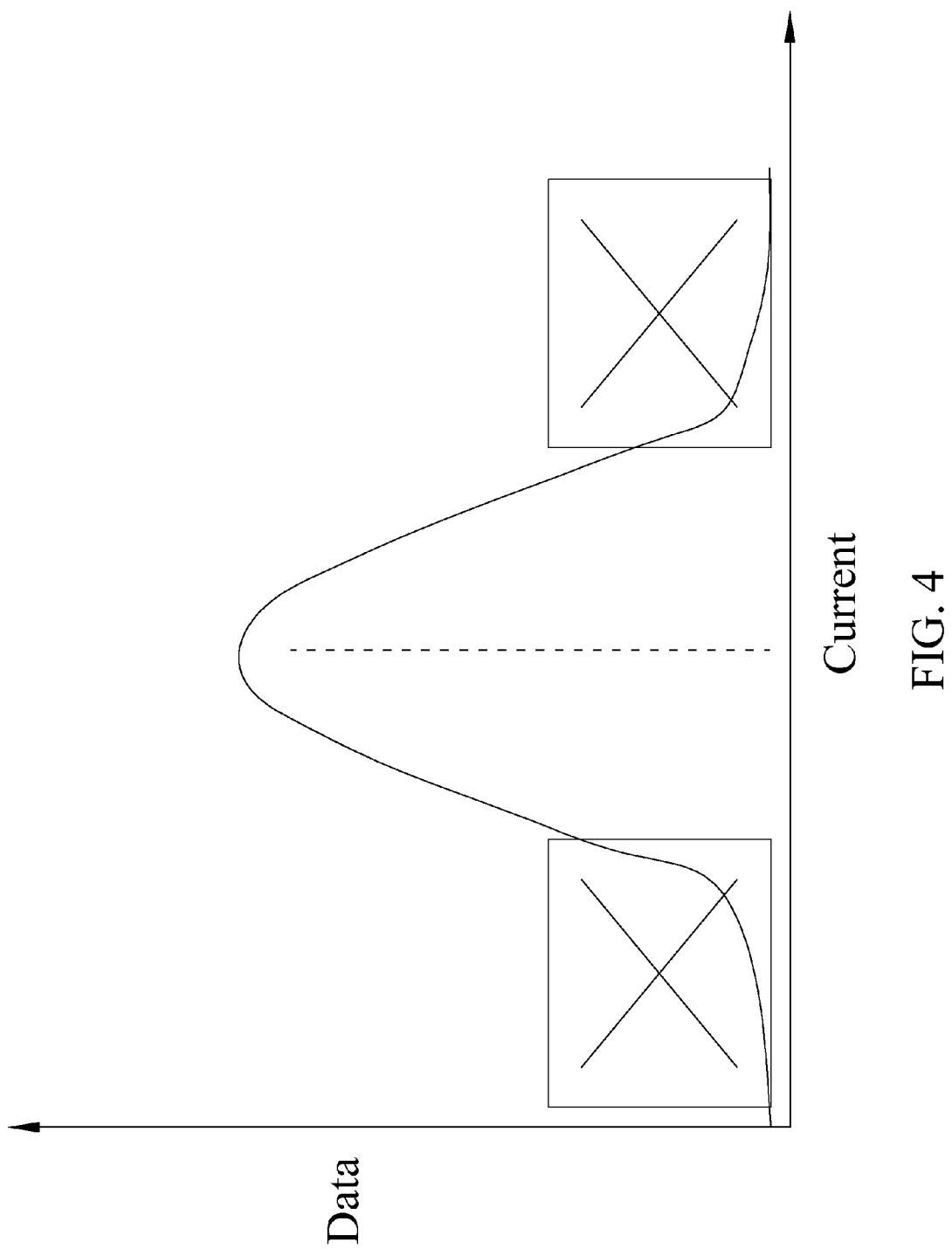
FIG. 4 is a diagram showing the current distribution of the low-offset current-sense amplifier according to the preferred embodiment of the present invention.

Therefore, with the low-offset current-sense amplifier of the present invention, it is able to pick out from the N pieces of transistors ML1~MLN in the first current supply unit 21 n pieces of transistors that have relatively smaller process offset. The same way can be applied to the transistors MR1~MRN in the second current supply unit 22. The illustrated preferred embodiment can be explained with N being 4 and n being 2. That is, any two of the four transistors ML1~ML4 in the first current supply unit 21 can be selected for measuring the electric currents flowing out of six sets in the first current supply unit 21 (choose two from four, thus 6 combinations); any two of the four transistors MR1~MR4 in the second current supply unit 22 can be selected for measuring the electric currents flowing out of six sets in the second current supply unit 22. Then, use the processing unit 23 to record the electric currents flowing out of the sets, and it is able to know what electric current values of the combinations would show relatively larger differences compared to the electric current values of other transistors. Please refer to FIG. 4, which is a diagram showing the current distribution of the low-offset current-sense amplifier according to the preferred embodiment of the present invention. As shown, the processing unit 23 may use the above-described manner to know the combinations have relatively larger difference in electric current values, so as to avoid using the combinations with large difference in electric current values. Similarly, the processing unit 23 applies the same manner to the second coupling end InR and the second current supply unit 22 in the other half of the low-offset current-sense amplifier 2, in order to exclude the combinations with large difference in electric current values. In other words, the processing unit 23 can use the above manner to pick out the combinations that have electric current values closer to an average value $I_{MEAN}$, that is, to enable the use of transistors with smaller process offset to reduce the current offset of a differential current mirror.

While the active components in the circuit of the illustrated preferred embodiment of the present invention are P-type transistors, one of ordinary skill in the art, to which the present invention pertains, would understand that the active components in the circuit of the present invention may be otherwise N-type transistors, bipolar transistors, or combinations of bipolar transistors and field-effect transistors without departing from the spirit and scope of the present invention. Further, the values of 4 and 2 for N and n, respectively, are only for illustrating purpose and not intended to limit the present invention in any way.

While the above description of the low-offset current-sense amplifier of the present invention has also introduced a concept about the operating method of an amplifier, a flowchart showing more detailed steps of an amplifier operating method according to the present invention is nevertheless provided herein for the purpose of clarity.

Figure 5:
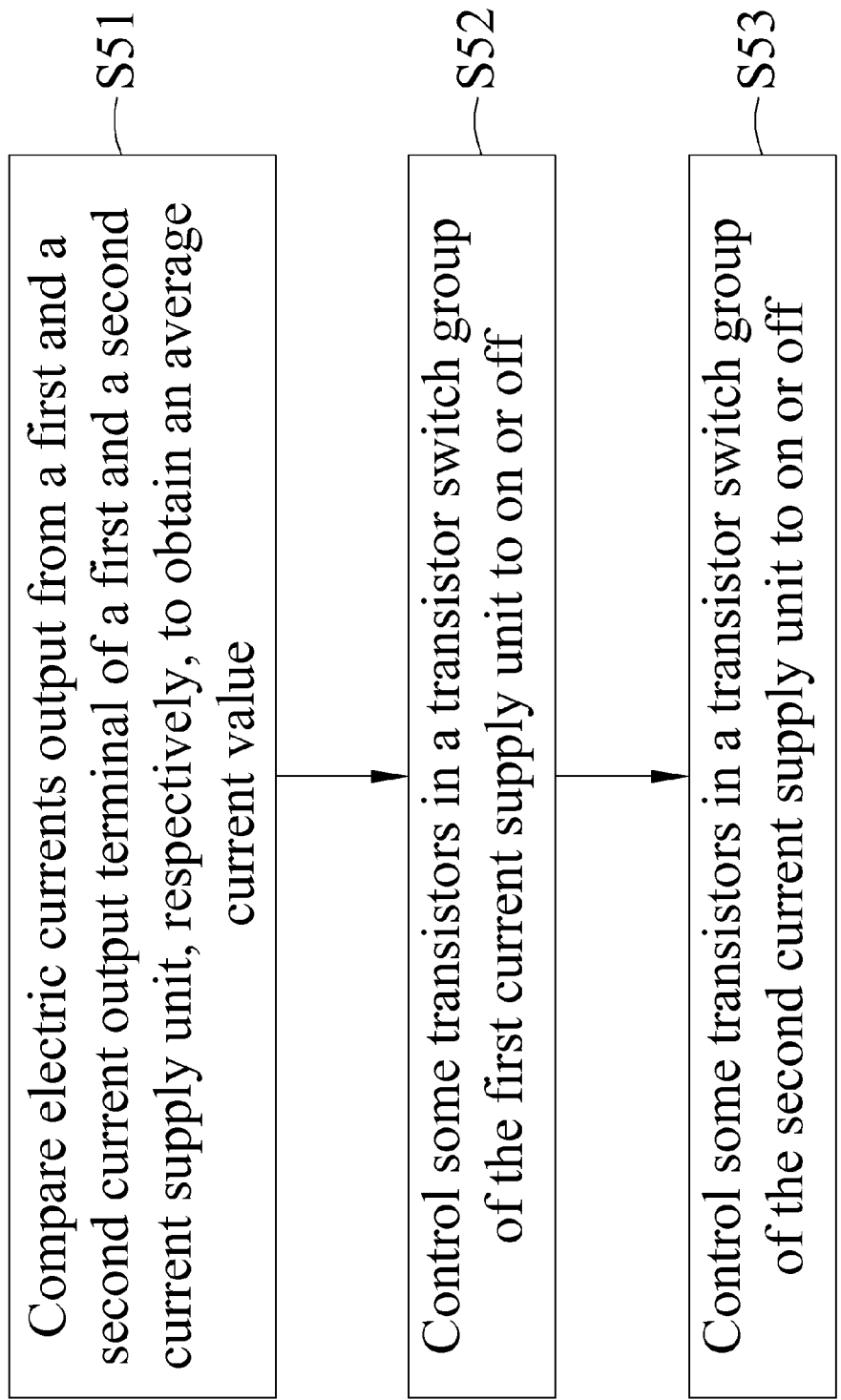
FIG. 5 is a flowchart showing the steps included in an amplifier operating method according to the present invention.

Please refer to FIG. 5 that is a flowchart showing the steps included in an amplifier operating method according to the present invention. As shown, the operating method is applicable to a low-offset current-sense amplifier that includes a sense amplifier, a first current supply unit, a second current supply unit, and a processing unit.

In a first step S51, electric currents output from a first and a second current output terminal of the first and the second current supply unit, respectively, are compared to obtain an average current value.

In a second step S52, some transistors in a transistor switch group of the first current supply unit are controlled to on or off.

In a third step S53, some transistors in a transistor switch group of the second current supply unit are controlled to on or off.

Since the details and the implementation of the amplifier operating method of the present invention have already been recited in the above description of the low-offset current-sense amplifier of the present invention, they are not repeatedly discussed herein.

In conclusion, with the low-offset current-sense amplifier and the amplifier operating method according to the present invention, it is able to accurately pick out transistors having relatively smaller current offset for use. That is, with the present invention, it is able to use only the transistors with small process offset to thereby reduce the current offset of a differential current mirror and enable increased memory data access speed and accuracy.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A low-offset current-sense amplifier, comprising:
    a sense amplifier having a first coupling end and a second coupling end;
    a first current supply unit being coupled to the first coupling end, and having a first transistor group and a first current output terminal;
    a second current supply unit being coupled to the second coupling end, and having a second transistor group and a second current output terminal; and
    a processing unit being coupled to the first and the second current supply unit; the processing unit controlling some transistors in the first and the second transistor group to on or off according to electric currents output from the first and the second current output terminal, respectively,
    wherein the first transistor group and the second transistor group further include a first switch group and a second switch group, respectively; and the processing unit compares the electric currents output from the first and the second current output terminal to obtain an average current value for controlling some transistors in the first and the second switch group to on or off.

2. The low-offset current-sense amplifier as claimed in claim 1, wherein the first switch group is controlled to on or off via a plurality of digital signals.

3. The low-offset current-sense amplifier as claimed in claim 1, wherein the second switch group is controlled to on or off via a plurality of digital signals.

4. The low-offset current-sense amplifier as claimed in claim 1, wherein the first transistor group further includes a first transistor and a second transistor; the first transistor having a drain coupled to a source of the second transistor; and the second transistor having a gate coupled to a drain thereof and to the first coupling end.

5. The low-offset current-sense amplifier as claimed in claim 1, wherein the second transistor group further includes a third transistor and a fourth transistor; the third transistor having a drain coupled to a source of the fourth transistor; and the fourth transistor having a gate coupled to a drain thereof and to the second coupling end.

6. An amplifier operating method, being applicable to a low-offset current-sense amplifier having a sense amplifier, a first current supply unit, a second current supply unit and a processing unit; the amplifier operating method comprising the following step:
    controlling some transistors in a first transistor group of the first current supply unit and some transistors in a second transistor group of the second current supply unit to on or off according to electric currents output from a first current output terminal of the first current supply unit and a second current output terminal of the second current supply unit, respectively,
    wherein the amplifier operating method further comprises the following step:
    comparing the electric currents output from the first current output terminal and the second current output terminal to obtain an average current value; and
    controlling some transistors in a first switch group of the first transistor group to on or off.

7. The amplifier operating method as claimed in claim 6, wherein the first switch group is controlled to on or off via a plurality of digital signals.

8. The amplifier operating method as claimed in claim 6, further comprising the following step:
    controlling some transistors in a second switch group of the second transistor group to on or off after obtaining the average current value.

9. The amplifier operating method as claimed in claim 8, wherein the second switch group is controlled to on or off via a plurality of digital signals.

10. The amplifier operating method as claimed in claim 6, wherein the first transistor group further includes a first transistor and a second transistor; the first transistor has a drain coupled to a source of the second transistor; and the second transistor has a gate coupled to a drain thereof and a first coupling end of the sense amplifier.

11. The amplifier operating method as claimed in claim 6, wherein the second transistor group further includes a third transistor and a fourth transistor; the third transistor has a drain coupled to a source of the fourth transistor; and the fourth transistor has a gate coupled to a drain thereof and a second coupling end of the sense amplifier.

* * * * *

UNITED STATES PATENT AND TRADEMARK OFFICE
CERTIFICATE OF CORRECTION

| | | |
|---|---|---|
| PATENT NO. | : 8,497,710 B2 | Page 1 of 1 |
| APPLICATION NO. | : 13/108577 | |
| DATED | : July 30, 2013 | |
| INVENTOR(S) | : Meng-Fan Chang et al. | |

It is certified that error appears in the above-identified patent and that said Letters Patent is hereby corrected as shown below:

On the Title Page, Item (75) please correct the name of first inventor "Meng-Fan Cheng" to "Meng-Fan Chang" and the name of fourth inventor "Yu-Der Chen" to "Yu-Der Chih".

Signed and Sealed this
Twelfth Day of November, 2013

Teresa Stanek Rea
*Deputy Director of the United States Patent and Trademark Office*